US010223196B2

(12) United States Patent
Barrick et al.

(10) Patent No.: US 10,223,196 B2
(45) Date of Patent: *Mar. 5, 2019

(54) ECC SCRUBBING METHOD IN A MULTI-SLICE MICROPROCESSOR

(71) Applicant: International Business Machines Corporation, Armonk, NY (US)

(72) Inventors: Brian D. Barrick, Pflugerville, TX (US); James W. Bishop, Newark Valley, NY (US); Maarten J. Boersma, Holzgerlingen (DE); Marcy E. Byers, Rochester, MN (US); Sundeep Chadha, Austin, TX (US); Jentje Leenstra, Bondorf (DE); Dung Q. Nguyen, Austin, TX (US); David R. Terry, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/805,301

(22) Filed: Nov. 7, 2017

(65) Prior Publication Data
US 2018/0095820 A1    Apr. 5, 2018

Related U.S. Application Data

(63) Continuation of application No. 15/173,091, filed on Jun. 3, 2016, now Pat. No. 9,846,614.

(51) Int. Cl.
*G06F 11/10* (2006.01)
*G11C 29/52* (2006.01)
(Continued)

(52) U.S. Cl.
CPC .......... *G06F 11/106* (2013.01); *G06F 9/3016* (2013.01); *G06F 9/30098* (2013.01);
(Continued)

(58) Field of Classification Search
CPC ............... G06F 9/30138; G06F 9/3016; G06F 9/30098; G06F 11/1068; G06F 11/1405; G06F 11/106; G11C 29/42; G11C 29/52
See application file for complete search history.

(56) References Cited

U.S. PATENT DOCUMENTS 5,751,946 A    5/1998  Afsar et al.
7,043,679 B1   5/2006  Keltcher et al.
(Continued)

OTHER PUBLICATIONS

List of IBM Patents or Applications Treated As Related.
(Continued)

*Primary Examiner* — Shelly A Chase
(74) *Attorney, Agent, or Firm* — Patterson + Sheridan, LLP (57) ABSTRACT

Techniques for error correction in a processor include detecting an error in first data stored in a register. The method also includes generating an instruction to read the first data stored in the register, where the register is both a source register and a destination register of the instruction. The method further includes transmitting the first data to an execution unit, where the first data bypasses an issue queue. The method also includes decoding the instruction and correcting the error to generate corrected data and writing the corrected data to the destination register.

18 Claims, 4 Drawing Sheets

(51) Int. Cl.
  *G06F 9/30* (2018.01)
  *G06F 9/38* (2018.01)
  *G11C 29/04* (2006.01)

(52) U.S. Cl.
  CPC ........ *G06F 9/3855* (2013.01); *G06F 11/1048* (2013.01); *G06F 11/1068* (2013.01); *G11C 29/52* (2013.01); *G11C 2029/0409* (2013.01); *G11C 2029/0411* (2013.01)

(56) References Cited

U.S. PATENT DOCUMENTS

| | | |
|---|---|---|
| 7,673,190 B1 | 3/2010 | Engelbrecht et al. |
| 8,266,383 B1 | 9/2012 | Minkin et al. |
| 8,301,992 B2 | 10/2012 | Bybell et al. |
| 2006/0236165 A1 | 10/2006 | Cepulis et al. |
| 2009/0193296 A1 | 7/2009 | Kellington et al. |
| 2009/0327638 A1 | 12/2009 | Buch |
| 2014/0122840 A1* | 5/2014 | Abernathy .......... G06F 9/30138 712/225 |
| 2014/0146624 A1 | 5/2014 | Son et al. |

OTHER PUBLICATIONS

Tran et al., Dynamically reducing pressure on the physical register file, through simple register sharing, 2004, IEEE, pp. 78-88.

Shubhendu S. Mukherjee et al., "Cache Scrubbing in Microprocessors: Myth or Necessity?", Appears in the 10 th International Symposium on Pacific Rim Dependable Computing (PRDC), Mar. 3-5, 2004.

U.S. Appl. No. 15/173,091 entitled "ECC Scrubbing in a Multi-Slice Microprocessor," filed Jun. 3, 2016.

* cited by examiner

ECC SCRUBBING METHOD IN A MULTI-SLICE MICROPROCESSOR

CROSS-REFERENCE TO RELATED APPLICATIONS

This application is a continuation of co-pending U.S. patent application Ser. No. 15/173,091, filed Jun. 3, 2016. The aforementioned related patent application is herein incorporated by reference in its entirety.

BACKGROUND

The present invention relates to error correction, and more specifically, to correcting errors in register files in a processor.

In a processor, data may be stored in register files for processing instructions. Error detection and correction may be performed on the data. When an error is detected, an error correction process is initiated. Often, an error correction process requires a processing pipeline to be halted while the error is corrected. This results in lost processing time for the processor. In existing implementations, data operands stored in register files are read and checked for errors after instructions are issued by an issue queue. The issue queue tracks instructions with the use of instruction tags associated with each instruction. When an error is detected, processing is halted but the issue queue and processing logic must continue to track the status of instructions in progress. Unique data paths may also need to be implemented to transmit the data to an appropriate portion of the core for error correction processing. However, these operations are inefficient and complex.

SUMMARY

One embodiment of the present invention is a method for error correction in a processor. The method includes detecting an error in first data stored in a register. The method also includes generating an instruction to read the first data stored in the register, where the register is both a source register and a destination register of the instruction. The method further includes transmitting the first data to an execution unit, where the first data bypasses an issue queue. The method also includes decoding the instruction and correcting the error to generate corrected data and writing the corrected data to the destination register.

Another embodiment of the present invention is a system for error correction comprising a processor and a memory storing a program, which, when executed on the processor, performs an operation for error correction. The operation includes detecting an error in first data stored in a register. The operation also includes generating an instruction to read the first data stored in the register, where the register is both a source register and a destination register of the instruction. The operation also includes transmitting the first data to an execution unit, where the first data bypasses an issue queue. The operation further includes decoding the instruction and correcting the error to generate corrected data and writing the corrected data to the destination register.

Another embodiment of the present invention is a non-transitory computer-readable storage medium having computer-readable program code embodied therewith, the computer-readable program code configured to perform an operation for providing error correction in a processor, the operation including detecting an error in first data stored in a register. The operation also includes generating an instruction to read the first data stored in the register, where the register is both a source register and a destination register of the instruction. The operation further includes transmitting the first data to an execution unit, where the first data bypasses an issue queue. The operation also includes decoding the instruction and correcting the error to generate corrected data and writing the corrected data to the destination register.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein disclose techniques for error correction in a processor. In one embodiment, errors in data stored in register files such as general purpose registers (GPRs) or vector register files (VRF) can be corrected utilizing an issue queue (ISQ) as a staging path to detect and initiate an error correction process to scrub the register files. When an error in the data is detected, a flush of all threads in an execution slice is initiated to read out the history buffer entries and restore the entries to the GPRs. When the data from the history buffer is restored to the GPRs, a pervasive unit initiates a special state machine to read out GPR data and error correcting code (ECC) bits for scrubbing. Pseudo-instructions without instruction tags (ITAGs) are issued to perform error correction. The pseudo-instructions without ITAGs bypass the ISQ and send the data and ECC bits to an execution unit for error correction. This process simplifies the error processing logic.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

Figure 1:
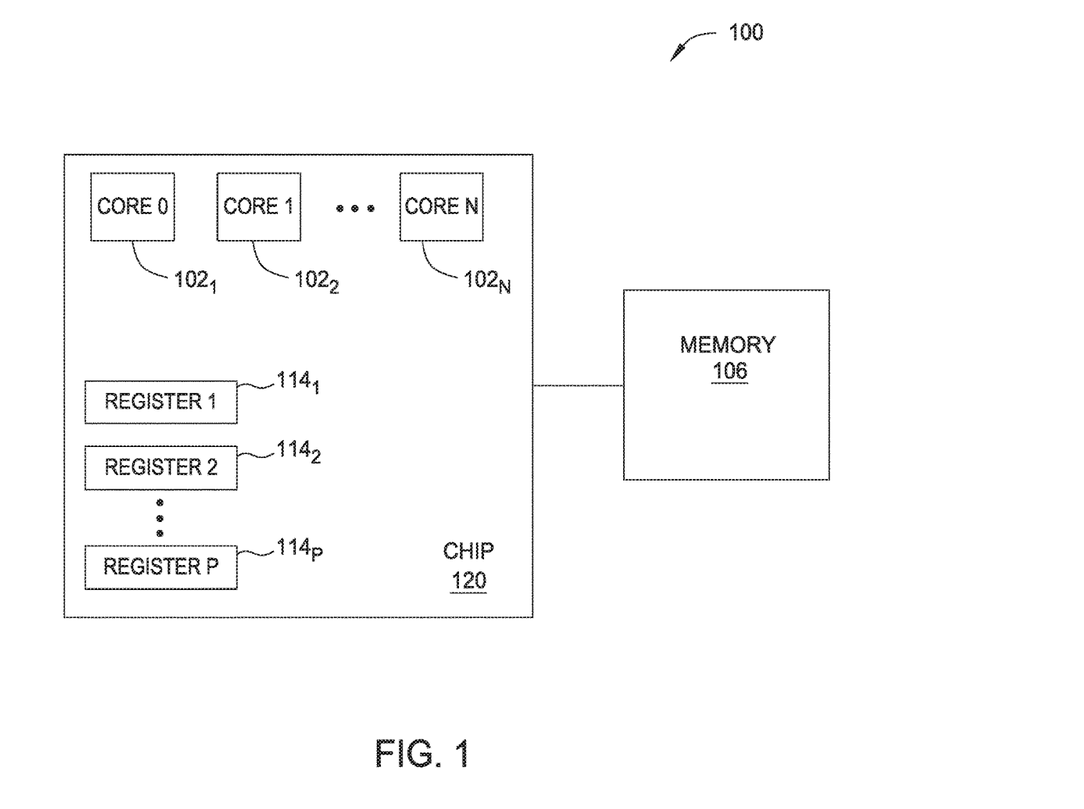
FIG. 1 illustrates a computing system for performing error correction, according to one embodiment described herein.

FIG. 1 illustrates a computer system 100 according to one embodiment. The computer system 100 includes a chip 120 that includes one or more processor cores 102, shown as Core 1, Core 2, ..., Core N. Embodiments described herein may utilize any number N of processor cores. In other embodiments, components of system 100 shown as on chip 120 may be located off the chip, and components of system 100 shown as off chip 120 may be located on the chip.

Computer system 100 also comprises memory 106. Memory 106 may comprise a random access memory (RAM), a read-only memory (ROM), an erasable programmable read-only memory (EPROM or Flash memory), an optical storage device, a magnetic storage device, or any suitable combination of the foregoing. Memory 106 is operable to store data that may be retrieved for computing operations. Memory 106 may also comprise memory that is on chip 120 and/or within cores 102.

Computer system 100 also comprises registers 114. Embodiments described herein may utilize any number P of registers 114, and each register 114 may be any length. Registers 114 store bits of information that can be read out or written. Registers 114 may be vector registers, general purpose registers, special purpose registers, or any other suitable register type. Although illustrated outside of cores 102 in FIG. 1, one or more registers 114 may be located within the cores 102. Each core 102 may comprise one or more execution slices for multithreading operation. The execution slices comprise an execution pipeline as described in further detail below. The pipelines represent multiple sequential steps for executing multiple computer instructions in parallel—e.g., a register load, add, copy, etc. To execute the computer instruction, the pipelines may send requests to store data in, or read data from, the registers 114. As described in further detail below, computer system 100 performs error correction on data stored in registers, such as GPRs, utilizing the components of the execution pipeline.

Figure 2:
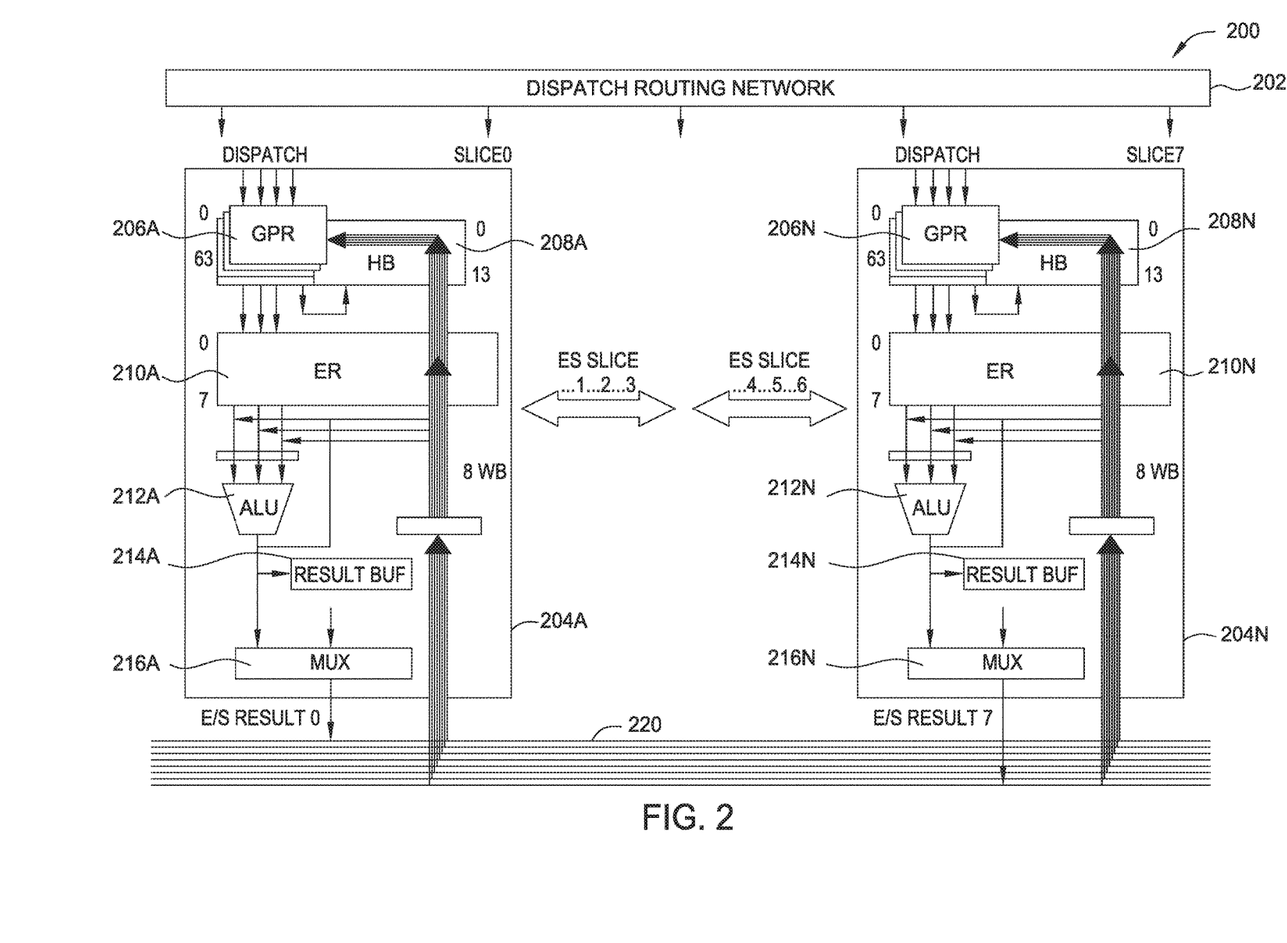
FIG. 2 illustrates example execution pipelines according to one embodiment.

FIG. 2 illustrates a processing system 200 within a core of a multi-core computer processor. In this example, eight execution slices (Slice0 to Slice7) operate in parallel (referred to as execution slices 204). Slice0 204A and Slice7 204N are illustrated in detail. Any number of slices may be present in other embodiments. A fetch unit (not illustrated) fetches instructions from an instruction cache or memory (also not shown) and sends the instructions to a dispatch routing network 202. The dispatch routing network 202 routes the instructions to the execution slices 204. In one embodiment, the processing system comprises an out of order machine. That is, instructions enter an instruction sequencing unit in order and exit the instruction sequencing unit out of order.

Each slice 204 comprises one or more GPRs 206. In one embodiment, each slice comprises 32 GPRs, but there could be any number of GPRs. When an instruction is dispatched from dispatch routing network 202, the general purpose registers 206 provide data for processing the instruction. For example, if an instruction is issued to add RA and RB, the GPRs provide RA and RB to an issue queue (not shown in FIG. 2), which stores the data in reservation station (ER) 210. When the issue queue issues the instruction, the data is sent to its destination for processing, such as a vector scalar unit (VSU) or a load store unit (LSU). As an example, an LSU performs load/store operations on the data, while a VSU performs functions such as add, subtract, rotate, permute, etc. on the data. Results of these operations may be stored in GPRs 206, or stored in other components or processing system 200. Results may also be stored in other types of registers, such as vector registers (not illustrated).

As illustrated in the execution slices 204, data for instructions is transmitted to the reservation station 210. Data and instructions are sent to arithmetic logic unit (ALU) 212 if arithmetic operations are to be performed, such as add, subtract, rotate, etc. Results from ALU 212 can be sent to a result buffer 214, a multiplexer 216, the reservation station 210, or to another suitable component of execution slice 204, including back to the input of the ALU 212 for another operation. The arrows within slice 204 denote some of the paths for instructions and data to traverse within the slice. Results from execution slice 204 are sent to writeback busses 220, illustrated as eight lines at the bottom of FIG. 2. Results on the writeback busses 220 can be sent to an issue queue, GPRs 206, history buffer 208, or other locations in this execution slice or another slice. As one example, after an operation is performed by ALU 212, such as an add operation, the result is transmitted to a GPR 206 via writeback busses 220.

Each slice 204 has an associated history buffer 208. History buffers 208 back up data from GPRs 206 when a new instruction is dispatched and the data in the target register needs to be saved. The data is saved in history buffer 208 in case that data needs to be restored to GPRs 206 in the future. Data may be flushed from the GPRs 206 and need to be restored from history buffer 208 for a variety of reasons. One reason is branch mis-prediction, where a processing unit mis-predicts the next instruction to process in branch prediction. Other reasons for a flush include interrupts, load data misses, or data errors. In one embodiment herein, errors are detected and an error correction process is initiated. During a flush associated with the error correction process, the history buffer 208 restores relevant data from history buffer 208 back into the appropriate GPR 206.

Occasionally, the data stored in a GPR 206 may contain an error. ECC bits can also be stored with the data in each GPR 206 to provide error detection and correction. In one embodiment, each GPR 206 stores 64 bits of data and 8 ECC bits, although any number of data and ECC bits may be used in other embodiments. The ECC bits are used to detect an error in the data stored in the GPR 206. In this embodiment, a single-bit error is recoverable. That is, an error correction process can detect the error, halt processing, correct the data, and restart the instruction stream again. In other embodiments, errors larger than a single-bit error may not be recoverable.

Figure 3:
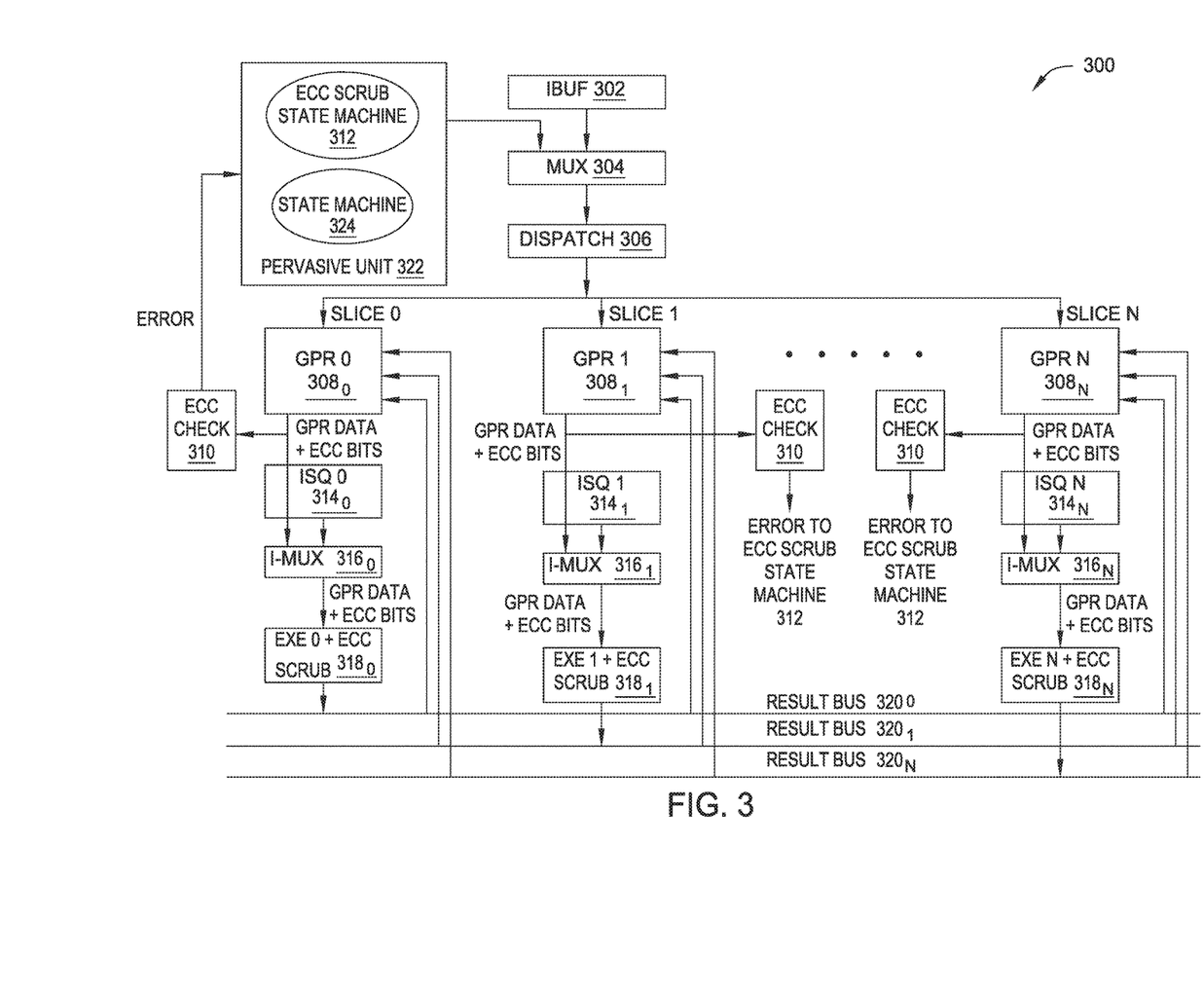
FIG. 3 illustrates an example flow of an error correction process in an execution pipeline according to one embodiment.

FIG. 3 illustrates an example flow 300 of an error correction process in an execution pipeline according to one embodiment. FIG. 3 is a conceptual diagram, and does not illustrate each of the components of the execution slices shown in FIG. 2, but does illustrate additional components and/or processes. As a brief overview of the process, if an error in a GPR 308 data is detected, the GPR 308 needs to be read out and scrubbed to fix the error. A pervasive unit 322 flushes out all threads and restores all relevant data from the history buffer (not illustrated in FIG. 3) and writes the data to the GPRs 308. The pervasive unit 322 then executes a special state machine 324 to read out GPR 308 data entries and send the data entries to the ECC scrubber state machine 312. ECC scrubber state machine 312 generates pseudo-instructions (that is, instructions that do not include instruction tags) to read the data from the GPR 308 and send the data and the ECC bits to an execution unit 318. Execution unit 318 sends the data and ECC bits to ECC scrubber state machine 312 to correct the error in the data. The resulting corrected data is then routed to the appropriate GPR 308 via result bus 320. When all errors in the GPRs 308 have been corrected, the processor can resume fetching instructions from the last flush point.

A more detailed description of the error correction process is described below. Flow 300 illustrates three example execution slices Slice0, Slice1, and SliceN. Any number of execution slices may be utilized by embodiments described herein. In one embodiment, as shown with respect to FIG. 2, eight execution slices are utilized in the processing core. An instruction buffer (or an instruction cache) 302 sends instructions to a multiplexer 304, which in turn forwards those instructions to dispatch 306. Dispatch 306 transmits each of the instructions to one of the execution slices for processing.

When an instruction is dispatched to an execution slice, source data for the instructions is read from the appropriate GPR 308 and sent to a reservation station (as shown in FIG. 2, but not illustrated in FIG. 3). GPR data is also checked against the ECC bits for errors via ECC check 310. As shown in FIG. 3, GPR data+ECC bits are read from the GPR 308 and used by ECC check 310 in each execution slice to detect errors. If an error is detected in a slice, each GPR in the slice is read out and scrubbed to fix any errors, via the processes described herein. As noted above, a slice may comprise 32 GPRs in one embodiment.

If an error is detected via ECC check 310, instruction fetch is stopped and pervasive unit 322 is notified. The pervasive unit 322 is a unit that accomplishes various tasks for various other units in a processor. Some such tasks are the error correction processes described herein. The first task for the pervasive unit 322 is to flush out the threads. Pervasive unit 322 requests a flush to flush out all threads that are in process in the execution slice where the error was detected. Flushing the threads restores the relevant data from the history buffers (not illustrated in FIG. 3) to the respective GPRs 308. The other execution slices may continue to execute if an error has not been detected in those respective slices.

After the history buffer flush and restore process is complete, pervasive unit 322 initiates a special state machine 324 to read out GPR entries to send to the ECC scrubber state machine 312. ECC scrubber state machine 312 generates pseudo-instructions to read out the data from each GPR 308. Pseudo-instructions are instructions without instruction tags (ITAGs). In general, instructions have ITAGs, and a completion unit (not illustrated in FIG. 3) uses the ITAGs to track which instructions have and have not been completed. Issue queue 314 also tracks instruction with the use of ITAGs. Pseudo-instructions do not need these ITAGs. Pseudo-instructions are not recognized by the completion unit but are recognized by other units, such as an ALU. Therefore these pseudo-instructions are not put into a completion buffer by the completion unit for processing. Allowing these pseudo-instructions to be processed without the involvement of the completion unit simplifies the implementation of the embodiments described herein.

The ECC scrubber state machine 312 generates one pseudo-instruction for each GPR 308 location. For example, 32 pseudo-instructions are generated for an execution slice to move the GPR data if the GPR 308 comprises 32 registers. The pseudo-instructions have the same source register as destination register. In other words, the pseudo-instruction will read the data stored in GPR 5 (the source register), for example, and the result of the pseudo-instruction will also be placed into GPR 5 (the destination register). Therefore, after ECC correction is performed on the data, the data is written back to the same GPR location.

The pseudo-instructions read out a GPR 308 entry and send GPR data to the issue queue (ISQ 314). ISQ 314, however, does not write the pseudo-instruction and GPR data into the issue queue. Instead, it uses issue bypass to route the pseudo-instruction and the GPR data and ECC data to an execution unit (such as a VSU). Issue bypass is illustrated in FIG. 3. An arrow from the bottom of each GPR 308 is shown that bypasses the issue queue 314 and transmits the data directly to an issue multiplexer 316. As noted above, bypassing the issue queue simplifies the process for error correction.

Issue multiplexer 316 transmits the data and pseudo-instruction to an execution unit. As shown in FIG. 3, an execution unit performs an ECC scrubbing process in block 318. A VSU can perform the ECC scrubbing process in certain embodiments. The VSU comprises an error corrector mechanism or error corrector logic. The VSU decodes the pseudo-instruction, and recognizes that the pseudo-instruction is a request to perform error correction. The VSU can send the GPR data along with the ECC bits to the ECC scrubbing state machine 312 in pervasive unit 322 to fix the data with the appropriate error correction processes.

After the GPR data has been corrected, the resulting GPR data is placed on the result bus 320 and routed to the GPRs 308, as illustrated by the arrows from result bus 320 to GPR 308 in FIG. 3. The corrected data is written to the appropriate destination register. The above steps can then be repeated for all GPR entries.

Because the pseudo-instruction was never written into a completion table by the ISQ 314, the ISQ 314 does not have to finish or complete the pseudo-instruction. As noted above, this simplifies the implementation of the embodiments described herein. When all GPRs 308 are fixed with the ECC scrubber state machine 312, the processor core can resume fetching instructions from the flushed point.

Figure 4:
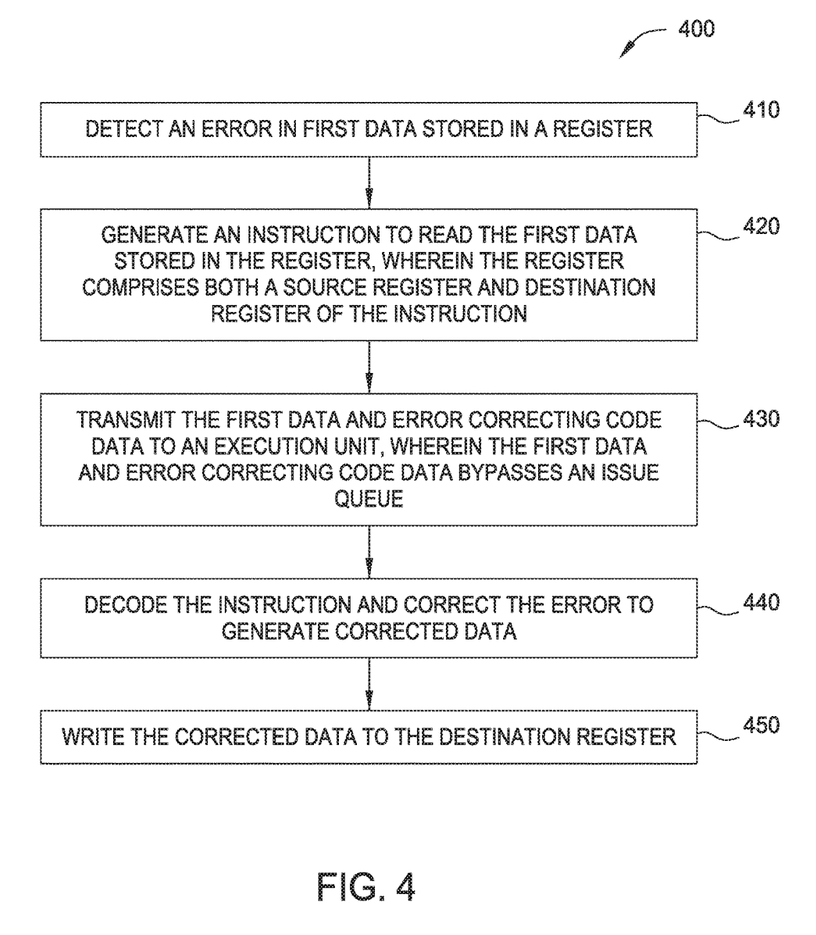
FIG. 4 is a flow chart for performing error correction in a processor, according to one embodiment described herein.

FIG. 4 illustrates a flow chart for performing error correction in a processor, according to one embodiment described herein. Although the method steps are described in conjunction with the systems of FIGS. 1-3, persons skilled in the art will understand that any system configured to perform the method steps, in any suitable order, falls within the scope of the present invention. In various embodiments, the hardware and/or software elements described above in FIGS. 1-3 can be configured to perform the method steps of FIG. 4.

A method 400 begins at step 410 where an error is detected in first data stored in a register. The register may be a GPR, such as GRP 206 or GPR 308. ECC bits can also be stored in the register with the first data. The first data comprises data that will be used to process instructions in a processor core. The error can be detected by utilizing an error detection algorithm on the ECC bits. Any suitable method of error detection can be used. An ECC check unit or module 310 may perform the ECC check to detect the error.

In some embodiments, after detecting the error, the method includes flushing the first data from the register and restoring the register with data from a history buffer, such as history buffer 208 illustrated in FIG. 2. This step restores relevant data from the history buffer to the register.

The method proceeds to step 420, wherein a state machine generates an instruction to read the first data stored in the register, where the register comprises both a source register and a destination register of the instruction. The state machine may be initiated in a pervasive unit in a processor, such as pervasive unit 322 illustrated in FIG. 3. In some embodiments, the instructions are pseudo-instructions that do not have ITAGs. Because the source register and destination register of the instruction are the same, the instruction will read the data from the register and write the corrected data back to the same register after error correction.

The method proceeds to step 430, where the first data and error correcting code data are transmitted from the register to an execution unit, and where the first data and error correcting code data bypasses an issue queue. The instruction instructs the issue queue to bypass the issue queue and route the instruction along with the first data and error correcting code data to the execution unit. Because the instruction and data bypass the issue queue, the issue queue does not have to finish or complete the instruction like it would in normal instruction processing. Therefore, this method is less complex than existing error correction methods, which require tracking the status of the instruction throughout the execution pipeline.

An issue queue such as issue queue 314 is illustrated in FIG. 3. FIG. 3 also illustrates execution and error scrub unit 318. FIG. 3 further illustrates the first data and error correcting data bypassing the issue queue 314. The execution unit may comprise a VSU or an ALU in certain embodiments. An ALU 212 is illustrated in FIG. 2.

The method proceeds to step 440, where the execution unit decodes the instruction and corrects the error to generate corrected data. The execution unit may utilize any suitable error correcting mechanism. The corrected data is then ready to return to the register. As noted above, the corrected data can be placed on a result bus 320 and routed to the appropriate register.

The method proceeds to step 450, where the corrected data is written to the destination register. The destination register is the same as the source register in this embodiment. Therefore, the data has been corrected and returned to its original location in the register. Once all registers have been error-corrected, the processor can resume processing by fetching a next instruction from an instruction cache or instruction buffer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method for error correction in a processor, comprising:
   detecting an error in first data stored in a register;
   generating an instruction to read the first data stored in the register, wherein the register comprises both a source register and a destination register of the instruction, and wherein the instruction is a pseudo-instruction without an instruction tag;
   transmitting the first data to an execution unit, wherein the first data bypasses an issue queue;
   decoding the instruction and correcting the error to generate corrected data; and
   writing the corrected data to the register.

2. The method of claim 1, wherein the pseudo-instruction instructs the first data to bypass the issue queue.

3. The method of claim 1, further comprising:
   after detecting the error, flushing the first data from the register and restoring the register with data from a history buffer.

4. The method of claim 3, further comprising:
   after writing the corrected data, fetching a next instruction from an instruction cache.

5. The method of claim 1, wherein an error correcting code data is stored in the register.

6. The method of claim 1, further comprising:
   after detecting the error, halting the processor from fetching new instructions.

7. The method of claim 1, wherein detecting an error in first data stored in a register comprises performing an error correction check on the first data before the first data is sent to the issue queue.

8. A computer program product, comprising:
   a non-transitory computer-readable storage medium having computer-readable program code embodied therewith, the computer-readable program code configured to perform an operation for providing error correction in a processor, the operation comprising:
   detecting an error in first data stored in a register;
   flushing the first data from the register and restoring the register with data from a history buffer,
   generating an instruction to read the first data stored in the register, wherein the register comprises both a source register and a destination register of the instruction;
   transmitting the first data to an execution unit, wherein the first data bypasses an issue queue;
   decoding the instruction and correcting the error to generate corrected data; and
   writing the corrected data to the destination register.

9. The computer program product of claim 8, wherein the instruction is a pseudo-instruction without an instruction tag.

10. The computer program product of claim 9, wherein the pseudo-instruction instructs the first data to bypass the issue queue.

11. The computer program product of claim 8, wherein detecting an error in first data stored in a register comprises performing an error correction check on the first data before the first data is sent to the issue queue.

12. The computer program product of claim 8, wherein an error correcting code data is stored in the register.

13. An integrated circuit, comprising:
   a register;
   an issue queue comprising an input coupled to an output of the register;
   an execution unit comprising an input coupled to an output of the issue queue; and
   a checking circuit configured to detect an error in first data stored in the register,
   wherein the register is configured to transmit the first data to the execution unit, wherein the first data bypasses the issue queue;
   wherein the execution unit is configured to decode the instruction, correct the error to generate corrected data, and write the corrected data in the register;
   wherein after detecting the error, the integrated circuit is configured to halt the processor from fetching new instructions.

14. The integrated circuit of claim 13, further comprising:
   a state machine configured to generate an instruction to cause the register to transmit the first data to the execution unit, wherein the instruction is a pseudo-instruction without an instruction tag.

15. The integrated circuit of claim 14, wherein the pseudo-instruction instructs the first data to bypass the issue queue.

16. The integrated circuit of claim 13, further comprising:
a history buffer; and
a state machine configured to flush the first data from the register and restore the register with data from the history buffer.

17. The integrated circuit of claim 13, further comprising:
an instruction cache; and
a fetch unit configured to fetch a next instruction from the instruction cache after the corrected data is written to the register.

18. The integrated circuit of claim 13, further comprising:
a fetch unit configured to halt from fetching new instructions after the error is detected.

* * * * *